United States Patent [19]

Zuraski et al.

[11] Patent Number: 5,589,805

[45] Date of Patent: Dec. 31, 1996

[54] ENHANCED RESOLUTION PULSE WIDTH MODULATION CONTROL

[75] Inventors: Jeffery A. Zuraski, Saginaw; Mark P. Colosky, Vassar, both of Mich.

[73] Assignee: General Motors Corporation, Detroit, Mich.

[21] Appl. No.: 554,173

[22] Filed: Nov. 6, 1995

[51] Int. Cl.$^6$ .................................................... H03K 7/08
[52] U.S. Cl. ...................... 332/109; 318/599; 318/811; 375/238
[58] Field of Search .................................. 332/109, 110; 375/238; 318/599, 811

[56] References Cited

U.S. PATENT DOCUMENTS 5,023,535  6/1991  Miller et al. ............................ 318/599

*Primary Examiner*—Siegfried H. Grimm
*Attorney, Agent, or Firm*—Vincent A. Cichosz

[57] ABSTRACT

A pulse width modulation system provides for enhanced output resolution through software control. The pulse width modulation control system normally has a control period during which the pulse width modulation state assumes a predetermined one of a plurality of output states. The method herein toggles between two adjacent output states during any single control period to effectuate a resultant system response characteristic of a system having a greater number of available output states. Furthermore, certain preferred implementations may also suppress undesirable harmonic excitation of the system through quasi-random toggling.

5 Claims, 3 Drawing Sheets

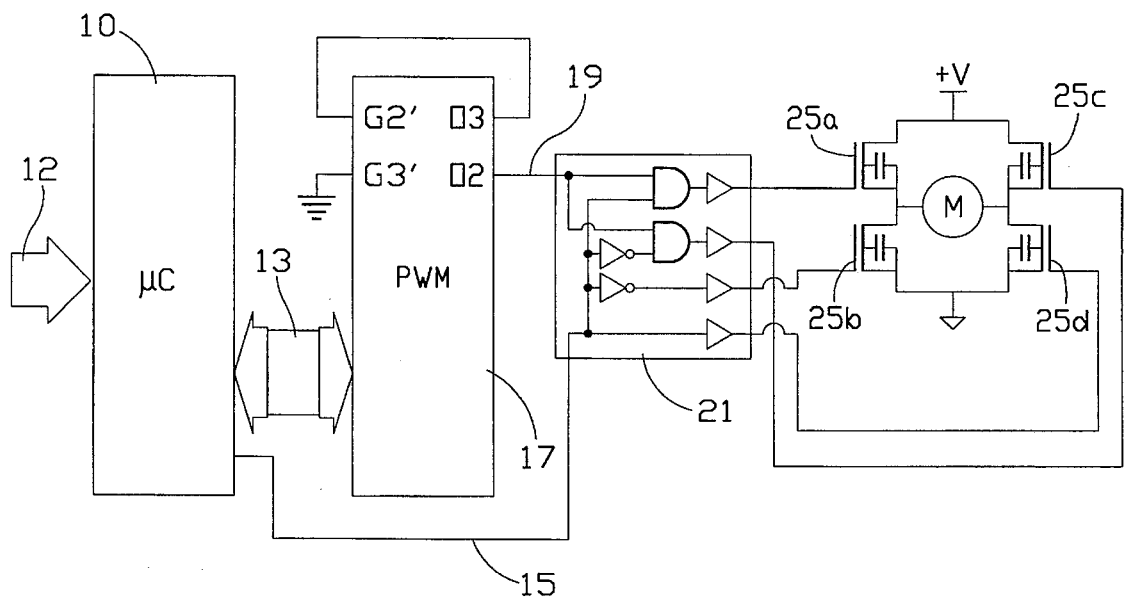
FIG. 3
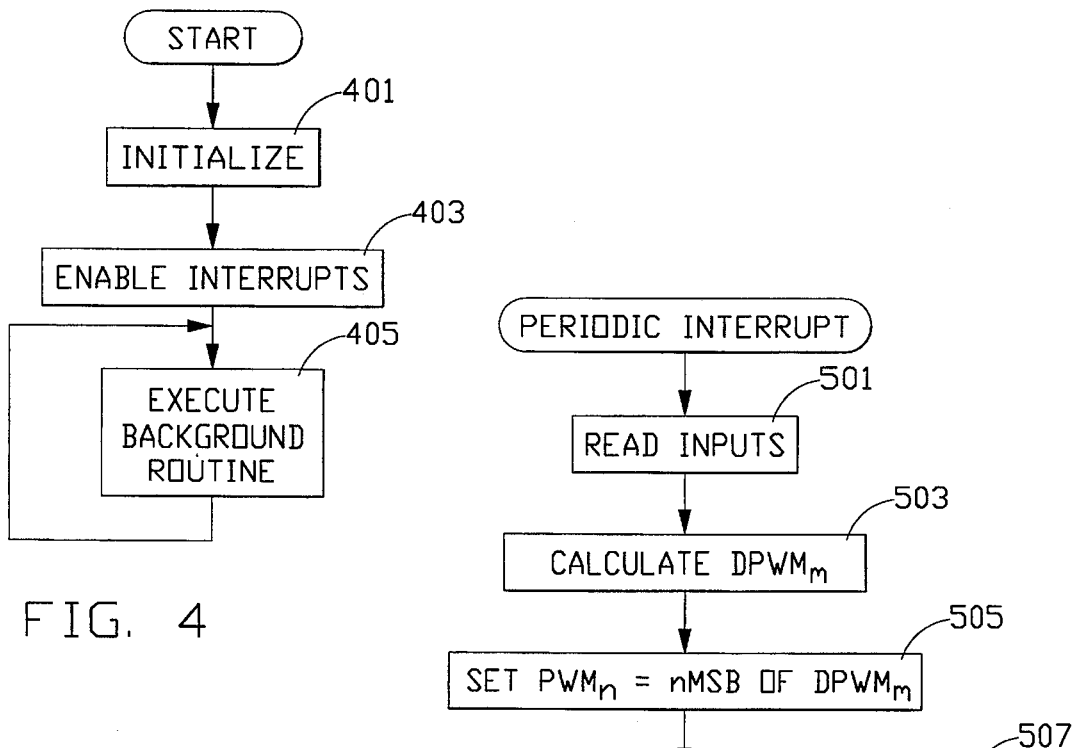
FIG. 4
FIG. 5

ENHANCED RESOLUTION PULSE WIDTH MODULATION CONTROL

BACKGROUND

The present invention relates to pulse width modulation control. More specifically, it is concerned with software based improvements in the resolution of a PWM control output.

PWM control of electromechanical devices including motors and solenoids is well known. Such control is used to vary the speed and torque output of DC motors, and the response time, position and force of solenoid controlled actuators. The reactive characteristics of the particular load being driven by the PWM controller allows for the achievement of discrete output states for the particular load; for example, a discrete number of speeds for a DC motor and a discrete number of actuator positions corresponding to a respective stroke positions of a biased solenoid plunger.

The granularity or resolution of the device output states depends upon the resolution of the PWM output used to control the device. For a given range of output states, higher resolution in the PWM translates into higher resolution of the device being controlled thereby. Resolution enhancements have typically relied upon hardware alterations on the controller side to provide for more PWM states at the output. However, such hardware based approaches are typically fraught with significant cost penalties and use of non-standardized componentry.

SUMMARY

Therefore, the present invention seeks to provide for a simple, low cost approach to enhancing the output resolution of a PWM system which is otherwise limited in its resolution by hardware constraints.

A method of increasing the effective resolution of a PWM output control quantity in a PWM output control system is disclosed. A system includes a plurality of discrete PWM output states, each one of which corresponds to a respective state of the PWM output control quantity. In accordance with one aspect of the invention, the desired output state to be effected during a predetermined control period is determined. The desired output state's relationship with respect to the discrete PWM output states is used to establish as first and second PWM output states the pair of discrete PWM output states corresponding to the respective states of the PWM output control quantity which immediately flank the desired output state of the output control quantity. The first and second PWM output states are executed for respective total durations during the predetermined control period so as to result in the desired output state of the output control quantity.

In accordance with a preferred aspect of the present invention, the respective total durations of the first and second PWM output states during the predetermined control period are continuous durations.

In accordance with another preferred aspect of the present invention, only one of the respective total durations of the first and second PWM output states during the predetermined control period is continuous.

In accordance with another preferred aspect of the present invention, only one of the respective total durations of the first and second PWM output states during the predetermined control period is continuous and is initiated at a point within the control period which differs from a predetermined number of consecutive control periods.

In accordance with yet another preferred aspect of the present invention wherein only one of the respective total durations of the first and second PWM output states during the predetermined control period is continuous, the one continuous total duration is initiated at a substantially random point within the control period.

BRIEF DESCRIPTION OF THE DRAWINGS

FIG. 3 is a block diagram of a computer hardware based control system for carrying out the method in accordance with the present invention;

FIGS. 4–8 are various flow diagrams representing program steps executed by a micro-computer in a computer based system such as illustrated in FIG. 3 for carrying out the method of the present invention.

DETAILED DESCRIPTION

Figure 1A:
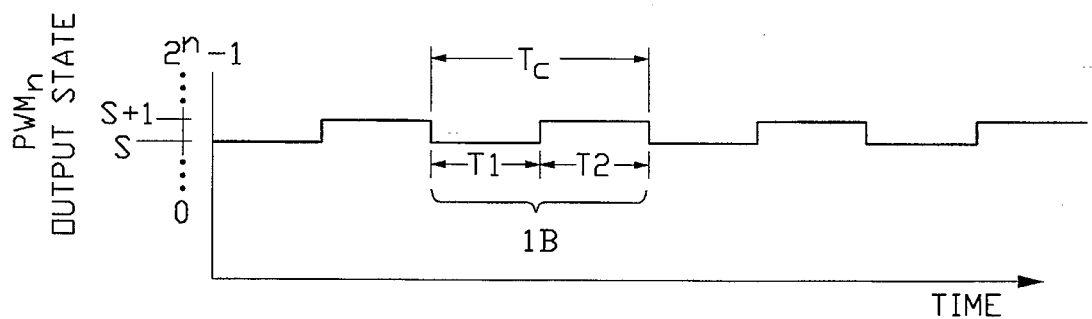
FIGS. 1A–1C are graphic representations of various aspects of pulse width modulation control in accordance with a first embodiment of the present invention.

Referring first to FIG. 3, a computer hardware based control system for pulse width modulation control of a bi-directional DC motor in accordance with the present invention is shown. Such system is exemplary with respect to hardware induced constraints upon pulse width modulation resolution as described at a later point. A general purpose microcomputer having conventional microprocessor, ROM, RAM, I/O, and high speed clock is generally labeled 10 in the figure. Microcomputer 10 receives various input signals including such conventional motor control signals as derived from conventional accelerometers, position encoders, torque and/or current sensors (not shown), any or all of which signals are represented in the aggregate by line 12. Microcomputer 10 is interfaced to PWM generation logic 17 via system bus 13 which includes address, bi-directional data, and control lines. Additionally, system bus 13 includes a clock line interfacing a clock output from microcomputer 10 to PWM generation logic 17 for data transfer and timer function control. The clock output is conventionally supplied as some whole number fraction of the high speed clock. For example, a microcomputer based around any of the variety of 6800 family of Motorola microprocessors running on a typical high speed clock frequency of 4 MHz would provide an external clock output of one-quarter of the high speed clock frequency, or 1 MHz.

PWM generation logic 17 in turn provides a pulse width modulation output signal on line 19 in accordance with control dam supplied thereto by microcomputer 10. The pulse width modulation signal on line 19 is input to conventional combinational logic 21 including appropriate isolation and gate level circuitry for driving conventional power switching devices 25a–25d in a manner to effectuate the desired motor operation. Switching devices 25a–25d may comprise, for example, bipolar transistors or field effect transistors. The latter choice generally being limited to switching frequencies of not greater than 20 KHz, and the former generally being limited to switching frequencies of not greater than 10 KHz. Such switching frequency limitations derive from thermal constraints of the device and also the desire to keep undesirable EMI to an acceptably low level. Combinational logic 21 is further responsive to a directional control signal from microcomputer 10 on directional line 15 to establish the rotative direction of the motor. A high logic signal on directional line 15 is seen to close switching device 25d, open switching devices 25b and 25c, and gate switching device 25a to respond in accordance with the PWM signal on line 19. Similarly, a low logic signal on directional line 15 is seen to close switching device 25b, open switching devices 25d and 25a, and gate switching device 25c to respond in accordance with the PWM signal on line 19. Therefore, only one of the two diagonal pairs of switching devices will be operative at any given time in accordance with the signal on directional line 15. Details of such combinational logic are well within the knowledge of those skilled in the art and therefore are not further described herein. Likewise, the arrangement of switching devices is conventionally referred to as an H-bridge and requires no additional description herein.

In the present exemplary hardware embodying the control of the present invention, PWM generation logic comprises the commercially available Motorola Programmable Timer Module (PTM) commonly designated MC6840. Alternative commercially available hardware may likewise be employed, the present choice being one of mere preference and not of limitation. The MC6840 is a twenty eight pin integrated circuit package of general application in computer based systems for various timing functions including pulse width modulation as in the present application. Bus 13 as mentioned earlier includes a bi-directional data bus (8-bits), address, control, and clock functions. The MC6840 includes three independent count-down timers (t1–t3) comprising three respective 16-bit latch/counter pairs and respective clock inputs. Only two (t2 and t3) of the three timers are presently employed in carrying out the PWM functions of the present invention and each corresponding clock input is coupled to the same 1 MHz clock output of the microcomputer as described. The PWM logic 17 is therefore configured such that all timers are running off of the same clock input herein designated $T_{clk}$ at 1 MHz. Each respective employed latch accepts from microcomputer 10 via the 8-bit data portion of bus 13 two bytes of data corresponding to most significant and least significant bytes of a 16-bit binary number. Each 16-bit binary number corresponds to one of the desired pulse width modulation period ($T_{pwm}$) and the corresponding duty cycle thereof. The configuration illustrated assigns the third timer to the former and the second timer to the latter. Each timer has associated therewith a gate input G2' and G3', the numeral corresponding to the timer correspondence. Similarly, corresponding outputs O2 and O3 are illustrated, timer output O3 coupled to timer gate G2', timer gate G3' tied to ground, and timer output O2 tied to PWM output line 19.

As configured, timer t3 will operate in a continuous mode providing a square wave output at O3 with a period proportional to the contents of the corresponding timer latch. Timer t2 on the other hand will operate in a single shot-mode providing a high output at O2 for a duration proportional to the contents of the corresponding timer latch. Timer t2 is triggered by a negative transition of a signal at the respective gate input G2'. Since G2' is tied to timer t3 output O3, timer t2 will produce a single-shot pulse at regular intervals in accordance with the negative transition of the square wave output of timer t3. Therefore, it can be seen that a PWM period substantially proportional to the contents of the timer t3 latch is established and a duty cycle proportional to the contents of the timer t2 latch is established. In operation, the contents of timer t3 latch would not be varied so that a continuous predetermined pulse width modulation period $T_{pwm}$ would be set. However, the contents of timer t2 latch would vary in accordance with the desired duty cycle. As configured, the PWM logic 17 establishes a PWM period equal to $2*(N_3+1)*T_{clk}$, where $N_3$ is the corresponding latch contents. Likewise, the duration of the timer t2 single-shot is equal to $N_2*T_{clk}$, where $N_2$ is the corresponding latch contents. More specific details on the MC6840 PTM operation can be referenced in the manufacturer's data sheets.

The reactive characteristics of the motor operating in conjunction with the pulse width modulation (PWM) control in accordance with well known relationships to more or less average or smooth the control quantity, in this case the current, therethrough. The average current through an R/L load may be varied with the duty cycle of an applied voltage source, while the average voltage across an R/C load may be varied with the duty cycle of an applied current source. The present embodiment contemplates control of current by modulation of an applied voltage labeled V+ in the figure.

The hardware operating parameters as hereinbefore described are not untypical of any of a variety of PWM controlled systems. The limitations to which the present control is directed toward improving may best be illustrated by way of example using such hardware parameters as follows. Selecting field effect transistors as the switching devices, an acceptable range of switching frequencies and hence the range of acceptable base pulse width modulation frequencies is below 20 KHz. Such a frequency range corresponds to a range of pulse width modulation periods of not less than substantially 50 µS (1/20 KHz). With the PWM generation logic operating at a 1 MHz clock rate, or a period of 1 µS, a PWM resolution of only 2% (1 µS/50 µS) is obtainable at a 20 KHz base pulse width modulation frequency. While lowering the base pulse width modulation frequency will improve the resolution, the reactive characteristics of the load places practical limitations on how much compromise in the base frequency can be made to improve upon the resolution. Furthermore, lowering the pulse width modulation frequency increases the likelihood that objectionable noise will be generated thereby in the system. Nonetheless, for simplification of processing in the implementation of the present method, as well as for operating off of the switching device frequency limit, a pulse width modulation period of 64 µS presents itself as a reasonable choice in the present example. A pulse width modulation base frequency of substantially 15.6 KHz is thereby realized at pulse width modulation period of a convenient power of two. Therefore, it can be said that for the present example a total of 64, or $2^6$, discrete pulse width modulation states are available and the control will be limited to such resolution. These figures are of course exemplary; nonetheless, they illustrate the limiting effect that the switching device operating frequency, the PWM generation logic clock rate, the load reactive characteristics, audible noise, and data processing considerations may have upon the output resolution.

Turning now to the graph of FIG. 1A and proceeding with the exemplary parameters developed above for illustration, the horizontal axis is a relative representation of time and the vertical axis is a relative representation of the available number of discrete pulse width modulation output states of the control system. The pulse width modulation signal and a process variable representing same are designated $PWM_n$ and is, in the present embodiment, represented by a straight unsigned binary number in the range (0000 0000 through 0011 1111)$_2$ or (00 through 63)$_{10}$. The subscript designation 'n' represents the number of bits of resolution available in the pulse width modulation output signal. Where n-bits of resolution are available, $2^n$ pulse width modulation states are possible. In the present exemplary embodiment, the system has 6-bit resolution or $2^6=64$ available pulse width modulation states. It can be seen then along the vertical axis that the $PWM_n$ output states range numerically from zero to $2^n-1$. The state designated (s) represents some arbitrary $PWM_n$ output state, and the state designated (s+1) represents the next numerically higher $PWM_n$ state.

Conventionally, a predetermined control period ($T_c$) provides regular intervals of adjustment for the $PWM_n$ output state in accordance with a set of program instructions not germane to the present invention nor necessitating further discussion herein. That is to say, during each control period $T_c$, a conventional pulse width modulation control establishes and maintains a single one of the plurality of discrete $2^n$ $PWM_n$ output states. Each state, of course, would therefore correspond to a discrete average current through a load similar to the exemplary load. In accordance with the invention as illustrated in FIG. 1A, however, it can be seen that the $PWM_n$ output state varies between adjacent discrete $PWM_n$ output states (s) and (s+1) within such control period $T_c$. Designation of the $PWM_n$ output states, (s) and (s+1), as first and second $PWM_n$ output states, respectively, allows for congruous designations of corresponding first and second total durations thereof, $T_1$ and $T_2$, respectively. The first and second durations additively make up the control period $T_c$, or $T_c=T_1+T_2$. The exemplary control period, $T_c$, is detailed in the figure.

By employing the control methodology of the present invention as exemplified by a first embodiment as illustrated in FIG. 1A wherein each of a pair of numerically adjacent $PWM_n$ output states is effected for a respective total duration during a predetermined control period $T_c$, the effective resolution of the output control quantity, in this case current, is enhanced. The average current through the load is now additionally a function of two discrete $PWM_n$ output states during a single control period $T_c$. The average current through the load in the example at hand now falls between the respective average currents effected by the pair of the numerically adjacent $PWM_n$ output signals.

Figure 1B:
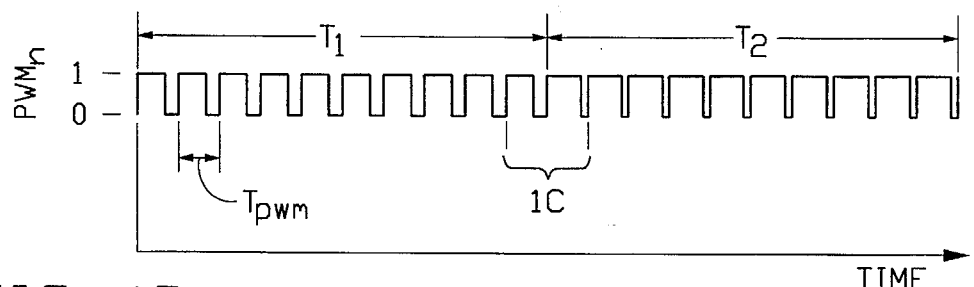

With reference now to FIG. 1B, the $PWM_n$ signal during a single such control period is illustrated. The first and second total durations, corresponding to the first and second $PWM_n$ output states, respectively, are shown. The $PWM_n$ output signal is shown to vary between low (0) and high (1) binary states, each adjacent pair of binary states comprising a single $PWM_n$ period. During the first duration, $T_1$, the duty cycle of the $PWM_n$ output signal is controlled to a first value, while during the second duration, $T_2$, the duty cycle thereof is controlled to a second value. The first and second duty cycle values correspond to the previously designated adjacent discrete output states (s) and (s+1). Further detail of a pair of single duty cycles, each corresponding to one of the first and second durations of $PWM_n$ output states and corresponding to the portion bracketed and labeled 1C, is illustrated in FIG. 1C.

Figure 1C:
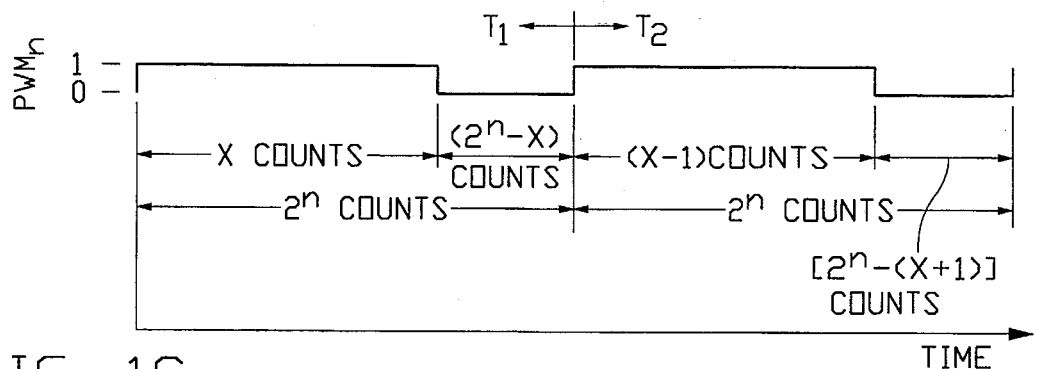

FIG. 1C shows the horizontal axis as a successive series of equivalent divisions or counts. The number of counts per each $PWM_n$ period of each respective $PWM_n$ output state is equal to $2^n$. The $PWM_n$ period corresponding to the first total duration $T_1$ is seen to have a first duty cycle with x counts high and $2^n-x$ counts low. The $PWM_n$ period corresponding to the second total duration $T_2$ is seen to have a second duty cycle with x+1 counts high and $2^n-(x+1)$ counts low. The duty cycles represented by the x and x+1 counts high correspond to duty cycles that make up adjacent discrete $PWM_n$ output states.

According to the control of the present invention, a desired pulse width modulation $DPWM_m$ output state is determined using a straight binary variable having a greater resolution than that of the available $PWM_n$. The subscript designation 'm' follows the same convention as used for $PWM_n$. In the present embodiment, $DPWM_m$ is assumed to have 8-bit resolution representing $2^8=256$ desired states having a one-to-one full scale correspondence to $PWM_n$. Therefore, the resolution of $DPWM_m$ is seen to be 2-bits ($2^2$), or a factor of four times, greater than that of $PWM_n$. Typically, such discrepancy in resolution capability between a processing variable and output control variable would be handled by truncation of the m-n least significant bits of the processing variable, perhaps with some rounding up or down in order to accommodate the limitations of the output. The present embodiment utilizes the m-n least significant bits in the determination of a time, duration or count split in the control period of the pulse width modulation control as will be further explained below with reference to the flow charts of FIGS. 4–6. The time split determines the respective first and second total durations corresponding to the first and second $PWM_n$ output states.

The embodiment illustrated in FIGS. 1A–1C implements the methodology of the invention with the total duration, $T_1$, of the first $PWM_n$ output signal being initiated at the start of the control period and the total duration $T_2$ of the second $PWM_n$ output signal being initiated after expiration of the total duration $T_1$. This imposes a periodic excitation of the load at a frequency corresponding to the control period $T_c$ due to the toggling between adjacent PWM output states at the regular interval equivalent to the control period frequency. Such a situation may disadvantageously result in performance degrading system oscillations or objectionable noise. These effects may be exacerbated by substantial coincidence of mechanical or electrical system natural resonant frequencies and the control period $T_c$.

Figure 2:
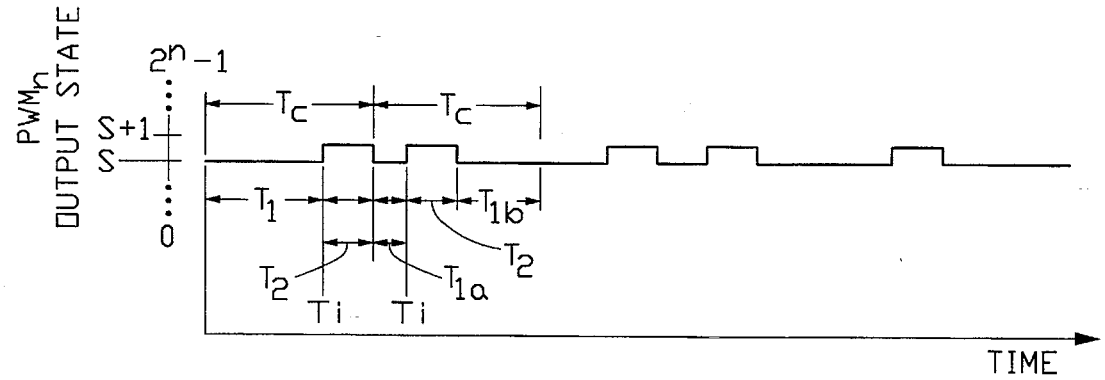
FIG. 2 is a graphic representation of a second embodiment of the pulse width modulation control according to the present invention.

An additional feature of the present invention addressing the potential undesirable excitation is illustrated with respect to FIG. 2. The illustration is similar to that shown in FIG. 1, with $T_c$ corresponding to the control period, and $T_1$ and $T_2$ corresponding to first and second total durations, respectively, of adjacent PWMn output states (s) and (s+1). Here, again, the first and second durations additively make up the control period $T_c$, or $T_c=T_1+T_2$. However, the duration $T_2$ is quasi-randomly initiated at a random point measured from the beginning of the current control period ($t_i$) such that the toggling between the adjacent PWM output states is substantially irregular over a series of control periods. Of course, practical limitations would likely dictate that such initiation points correspond to minimal intervals established by the clock period $T_{clk}$. Quasi-random or substantially random initiation as used herein means that the duration $T_2$ is initiated at a point $t_i$ within the control period $T_c$ after which sufficient time remains within the control period to complete the duration $T_2$ (i.e. Tc-ti≧$T_2$). Alternatively, quasi-random initiation as used herein means an initiation point which has not been utilized for a predetermined number of consecutive control periods, again with the objective that the duration $T_2$ is able to be completed within the current control period $T_c$. Alternatively, it is envisioned that quasi-random initiation may be adapted to allow for completion of the duration T2 across adjacent control periods; however, such control would require significant additional processing logic to ensure that the overall objective of establishing a specific output level is not compromised. Therefore, it follows from the above that the total duration $T_1$ will necessarily comprise sub-durations $T_{1a}$ and $T_{1b}$ ($T_1=T_{1a}+T_{1b}$) as illustrated. Additionally, while the embodiment above has been described with respect to duration $T_2$ being completed continuously, duration $T_1$ may be the chosen one of the two durations which is completed continuously.

Figure 6:
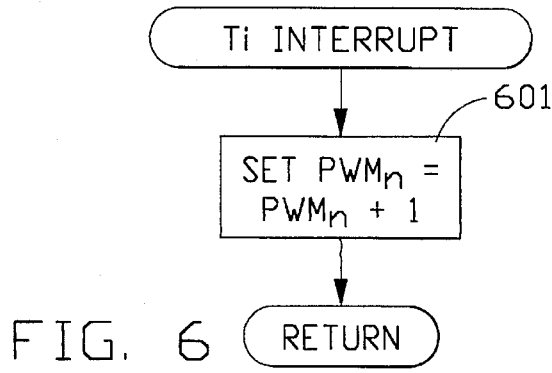

With reference now to FIGS. 4–6, a set of exemplary flow charts representing a series of program instructions executed by the microcomputer in carrying out the control of the present invention are illustrated. Beginning with FIG. 4, block 401 represents program steps executed when the PWM system is first powered up. For example, such steps include, but are not limited to, such tasks as initializing counters, timers, flags etc., and significantly, the task of loading the PWM logic timer $t_3$ latch with the predetermined binary data to establish the PWM period $T_{pwm}$. Thereafter, block 403 represents steps to enable interrupts as relate to the further flow charts of later figures. Block 405 is next encountered and represents generally continual execution of all steps of a background routine such as for example continuous signal conditioning, control and diagnostic routines for the PWM system.

FIG. 5 represents a series of program steps which are executed as part of a periodic interrupt routine, the period of interrupt corresponding to the control period $T_c$ of the PWM system as previously discussed. Block 501 represents steps for reading conditioned inputs which have been established from the various system parameters associated with input lines 12 as illustrated in FIG. 3 and discussed earlier. From such inputs, a desired pulse width modulation $DPWM_m$ value is calculated in accordance with a predetermined set of instructions. Any of a variety of known PWM control methodologies may be employed depending upon the desired system implementation, the precise methodology being inconsequential to the present invention and therefore not being set forth in further detail herein. $DPWM_m$ is, as previously discussed, an m-bit unsigned binary number and having an m-bit resolution. Such m-bit resolution will be recalled to be greater than the actual available n-bit resolution of the $PWM_n$ output; however, $DPWM_m$ has one-to-one full scale correspondence to the actual available $PWM_n$ output as mentioned. The steps of block 505 utilize the n most significant bits of $DPWM_m$ in establishing the actual $PWM_n$ output data for use in a first fractional duration of the control period $T_c$. $PWM_n$ is the whole number portion of the desired pulse width modulation $DPWM_m$ and corresponds to the numerically lower one of the two adjacent $PWM_n$ output states to be executed. Block further 505 encompasses loading of this data into the PWM logic timer $t_2$ latch for execution in the next pulse width modulation control period.

Block 507 next represents steps for calculating a fractional term (F) for use in establishing the respective durations of the adjacent $PWM_n$ states. F represents the fractional portion of the desired pulse width modulation $DPWM_m$. F is calculated by dividing the m-n least significant bits of $DPWM_m$ by the resolution enhancement factor afforded by the additional bits. It should be clear at this point that the scaling of the pulse width modulation period to an n-bit number of counts provides for simplistic processing by bit stripping and bit shifting to establish $PWM_n$ and F from $DPW_m$. It is here assumed that the contribution by each adjacent one of the two $PWM_n$ output states to the net effective (apparent) output is directly proportional to the respective durations thereof. It follows therefore that the fractional portion F of $DPWM_m$ may be used directly in the calculation of the effective durations of the two adjacent $PWM_n$ output states. This is illustrated in block 509 wherein an interrupt timer for initiating the numerically greater of the two adjacent PWM output states (Ti) is set to the unit complement of F (i.e. 1-F) multiplied by the control period $T_c$. Alternatively, F or its unit complement may be appropriately weighted or gained to account for known non-linearities in the system response. Ti corresponds to the duration of the lower of the two numerically adjacent PWMn output states. Alternatively stated, Ti represents the duration of the presently loaded $PWM_n$ value in the PWM logic timer t2 as established by the steps of block 505. Control is returned to the background program wherein Ti is decremented.

Expiration of Ti interrupts the background routine once again as illustrated in FIG. 6 wherein block 601 executes the program steps for establishing the $PWM_n$ output data for use in a second fractional duration of the control period $T_c$. $PWM_n$ is set to the next numerically higher output state PWMn +1 to be executed, which of course is greater than the desired pulse width modulation $DPWM_m$. Block 601 also encompasses loading of this data into the PWM logic timer t2 latch for execution in the current pulse width modulation control period. Control would then return to the background routine. In practice, the second duration is merely comprised of the time remaining in the control period $T_c$ as established by the periodic interrupt. The periodic interrupt will, of course, cause the execution of the steps represented by the flow chart of FIG. 5 as previously described, thereby repeating the iterative process of toggling between the two adjacent PWM output states which flank the desired output state for appropriate durations.

Figure 7:
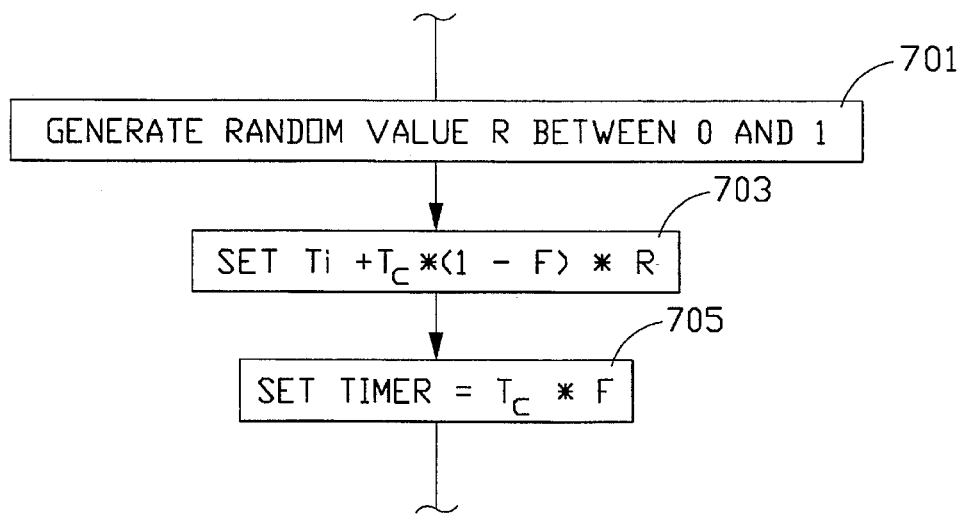
Figure 8:
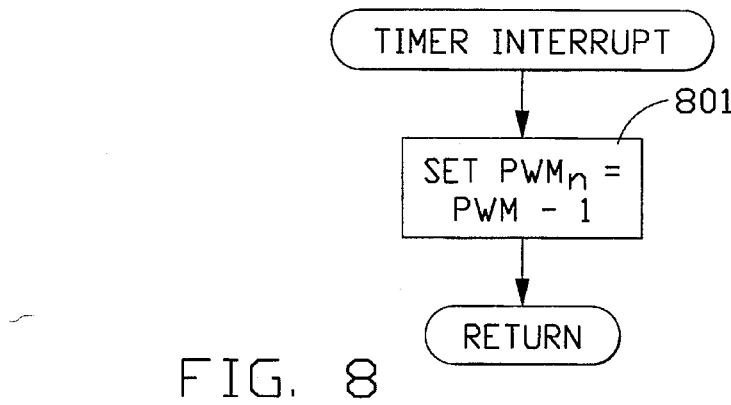

For the sake of completeness, FIGS. 7 and 8 represent steps executed in an embodiment utilizing a quasi-random implementation. The blocks 701–705 of FIG. 7 are understood to be implemented in place of block 509 of FIG. 5. The steps of block 701 would be executed to generate a random number (R) between 0 and 1 non-inclusive. Steps associated with block 703 would next set the interrupt timer for initiating the numerically greater of the two adjacent PWM output states (Ti). This is accomplished by setting Ti to the unit complement of F (i.e. 1-F) multiplied by the control period $T_c$ and the random value R. By multiplying by the random value R, the duration of the numerically higher of the two adjacent PWM output states to be executed is assured of an initiation time at a point ensuring sufficient time within the control period in which to finish. Block 705 executes steps for setting a duration interrupt timer (TIMER) to delimit the duration of the numerically greater of the two adjacent PWM output states. Processing would return to the background program as before and Ti would decrement. TIMER, however, would not decrement at this point. When expired, Ti would cause execution of the interrupt routine of FIG. 6 thereby toggling the output to the numerically higher one of the two adjacent PWM output states. Additionally, though not illustrated, TIMER would begin decrementing substantially contemporaneously with the execution of interrupt routine of FIG. 6.

In this case, however, the periodic interrupt at the control frequency is not relied upon to establish the termination of the present $PWM_n+1$ output state. Rather, TIMER expiration would cause the interrupt routine of FIG. 8 to execute, thereby performing all steps required to return the $PWM_n$ output state back to the numerically lower one of the two adjacent PWM output states.

While the present invention has been exemplified in certain preferred embodiments, the specific hardware and pendent limitations giving rise to the utility of the present invention are intended in no way to place limitations upon the scope of the invention. Likewise, the precise implementations herein disclosed are to be taken by way of example and not of limitation.

We claim:

1. A method of increasing the effective resolution of a pulse width modulated output in a pulse width modulated system including a plurality of discrete pulse width modulated output states, said method comprising the steps:

determining a desired output state to be effected during a predetermined control period;

determining a first pulse width modulated output state as one of the two of the plurality of discrete pulse width modulated output states which immediately flank said desired output state;

determining a second pulse width modulated output state as the other of the two of the plurality of discrete pulse width modulated output states which immediately flank said desired output state;

executing said first pulse width modulated state for a first total duration during said predetermined control period;

executing said second pulse width modulated state for a second total duration during said predetermined control period;

said predetermined control period comprising said first and second total durations.

2. A method of increasing the effective resolution of a pulse width modulated output in a pulse width modulated output system as set forth in claim 1 wherein each of said first and second total durations comprises respective continuous durations.

3. A method of increasing the effective resolution of a pulse width modulated output in a pulse width modulated output system as set forth in claim 1 wherein at least one of said first and second total durations comprises a continuous duration.

4. A method of increasing the effective resolution of a pulse width modulated output in a pulse width modulated output system as set forth in claim 1 wherein the steps are repetitively executed and each respective first total duration is continuous within the respective control period, each respective first pulse width modulated state being initiated at a respective initiation point within the respective control period which is different from other respective initiation points of respective first pulse width modulated states that are within a predetermined number of consecutive control periods.

5. A method of increasing the effective resolution of a pulse width modulated output in a pulse width modulated output system as set forth in claim 1 wherein the steps are repetitively executed and each respective first total duration is continuous within the respective control period, each respective first pulse width modulated state being initiated at a substantially random point within the respective control period.

* * * * *